(12) United States Patent
Fujimoto et al.

(10) Patent No.: US 10,338,617 B2
(45) Date of Patent: Jul. 2, 2019

(54) REGULATOR CIRCUIT

(71) Applicant: DENSO CORPORATION, Kariya, Aichi-pref. (JP)

(72) Inventors: Yuu Fujimoto, Kariya (JP); Yoshihide Kai, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/758,770

(22) PCT Filed: Sep. 13, 2016

(86) PCT No.: PCT/JP2016/076875
§ 371 (c)(1),
(2) Date: Mar. 9, 2018

(87) PCT Pub. No.: WO2017/051744
PCT Pub. Date: Mar. 30, 2017

(65) Prior Publication Data
US 2019/0050011 A1 Feb. 14, 2019

(30) Foreign Application Priority Data

Sep. 25, 2015 (JP) .................. 2015-188159

(51) Int. Cl.
*G05F 1/56* (2006.01)
*G05F 1/573* (2006.01)
(Continued)

(52) U.S. Cl.
CPC ....... *G05F 1/573* (2013.01); *G01R 19/16519* (2013.01); *G05F 1/56* (2013.01);
(Continued)

(58) Field of Classification Search
CPC .......... H02M 1/088; H02M 1/44; H01F 27/24
See application file for complete search history.

(56) References Cited

U.S. PATENT DOCUMENTS

| 6,897,638 B2 | 5/2005 | Miyanaga et al. |
| 7,602,162 B2 | 10/2009 | Barisal et al. |

(Continued)

FOREIGN PATENT DOCUMENTS

| JP | S63-316113 A | 12/1988 |
| JP | 2003-339115 A | 11/2003 |

*Primary Examiner* — Adolf D Berhane
*Assistant Examiner* — Afework S Demisse
(74) *Attorney, Agent, or Firm* — Posz Law Group, PLC

(57) ABSTRACT

A buffer stage includes a first transistor having a control terminal connected to an output terminal of an operational amplifier and a second transistor connected in series to a main energization path of the first transistor. An overcurrent controlling circuit is configured to apply an output voltage of the operational amplifier to the control terminal of the first transistor and allow a normal operation of the first transistor when an energization current of a main energization path of an output transistor detected by an overcurrent detection transistor is less than a predetermined value, and is configured to control the output voltage of the operational amplifier to a predetermined control voltage according to a current flowing in a main energization path of the overcurrent detection transistor when the energization current of the main energization path of the output transistor is equal to or greater than the predetermined value.

14 Claims, 11 Drawing Sheets

(51) Int. Cl.
*G01R 19/165* (2006.01)
*H03K 5/24* (2006.01)
*G05F 3/26* (2006.01)
*H02H 3/087* (2006.01)

(52) U.S. Cl.
CPC .......... *H03K 5/2472* (2013.01); *G05F 3/262* (2013.01); *H02H 3/087* (2013.01)

(56) References Cited

U.S. PATENT DOCUMENTS

| | | |
|---|---|---|
| 8,169,204 B2 | 5/2012 | Jian |
| 2008/0247099 A1 | 10/2008 | Hojo |
| 2010/0090665 A1 | 4/2010 | Jian |
| 2012/0098508 A1* | 4/2012 | Zhu .......................... G05F 1/56 323/272 |

* cited by examiner

REGULATOR CIRCUIT

CROSS REFERENCE TO RELATED APPLICATIONS

This application is a U.S. national stage application of International Application No. PCT/JP2016/076875 filed on Sep. 13, 2016 and is based on Japanese Patent Application No. 2015-188159 filed on Sep. 25, 2015, the disclosures of which are incorporated herein by reference.

TECHNICAL FIELD

The present disclosure relates to a regulator circuit.

BACKGROUND

For example, the regulator circuit is configured to supply a stable step-down power voltage from an output terminal using an operational amplifier (e.g., see patent literature 1). According to the patent literature 1, the operational amplifier compares a reference voltage generated by a reference voltage generating circuit and a feedback voltage feeding back an output voltage of the output terminal. Then, the operational amplifier outputs the step-down power voltage from the output terminal by driving a control terminal of an output transistor. When an overcurrent flows in a power line, there is a possibility of breaking of an element or meltdown of a wiring. Therefore, a protection circuit is provided to the regulator circuit. The protection circuit of the patent literature 1 folds back a sense current by a current mirror circuit and compares the sense current and a reference current, and thereby to protect the circuit from the overcurrent.

PATENT LITERATURE

Patent literature 1: US 2010/0090665 A1

SUMMARY

The regulator circuit includes a buffer stage between the operational amplifier and the output transistor and feeds back the output voltage of the output terminal to the operational amplifier. In such a configuration, inventors of the present disclosure attempt to provide a regulator circuit capable of resisting against high voltage even when the power voltage increases than usual. Also, the inventors attempt to provide the regulator circuit without employing an element having high voltage resistance in the overcurrent controlling circuit. Furthermore, the inventors aim to provide the regulator circuit capable of controlling the overcurrent with an area as small as possible. For example, in a Power Line Communication (PLC), the power voltage is likely to vary due to a signal superimposed on a power line. The inventors aim to provide the regulator circuit capable of controlling the overcurrent in this situation.

It is an object of the present disclosure to provide a regulator circuit capable of accurately performing an overcurrent control.

According to an aspect of the present disclosure, a regulator circuit is configured to receive a power voltage from a power supply unit to a first power line and output a constant voltage from an output terminal according to a reference voltage, and the regulator circuit includes a reference voltage generating circuit, an operational amplifier, a buffer stage, an output transistor, and an overcurrent controlling circuit.

The reference voltage generating circuit is configured to generate the reference voltage. The operational amplifier is configured to compare the reference voltage and a feedback voltage and output an output voltage. The feedback voltage is fed back according to the reference voltage and an output voltage of the output terminal of the regulator circuit. The buffer stage includes a first transistor and a second transistor. The first transistor has a control terminal connected to an output terminal of the operational amplifier. The second transistor is connected in series to a main energization path of the first transistor. The output transistor is connected posterior to the buffer stage, is connected to the second transistor to form a current mirror, and has a main energization path between the first power line and the output terminal of the regulator circuit.

The overcurrent controlling circuit includes an overcurrent detection transistor having a main energization path. The overcurrent controlling circuit is configured to apply the output voltage of the operational amplifier to the control terminal of the first transistor and allow a normal operation of the first transistor when an energization current of the main energization path of the output transistor, which is detected by the overcurrent detection transistor, is less than a predetermined value. The overcurrent controlling circuit is configured to control the output voltage of the operational amplifier to a predetermined control voltage according to a current flowing in the main energization path of the overcurrent detection transistor when the energization current of the main energization path of the output transistor is equal to or greater than the predetermined value.

When the output voltage of the operational amplifier is controlled to the predetermined control voltage, the regulator circuit is accurately protected from the overcurrent and the overcurrent control is accurately performed.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Hereinafter, embodiments of a regulator circuit with a protection circuit will be described with reference to the drawings. Like parts in the embodiments will be designated by the same symbols as the previous embodiments and descriptions thereof will not be repeated depending on situations.

First Embodiment

Figure 1:
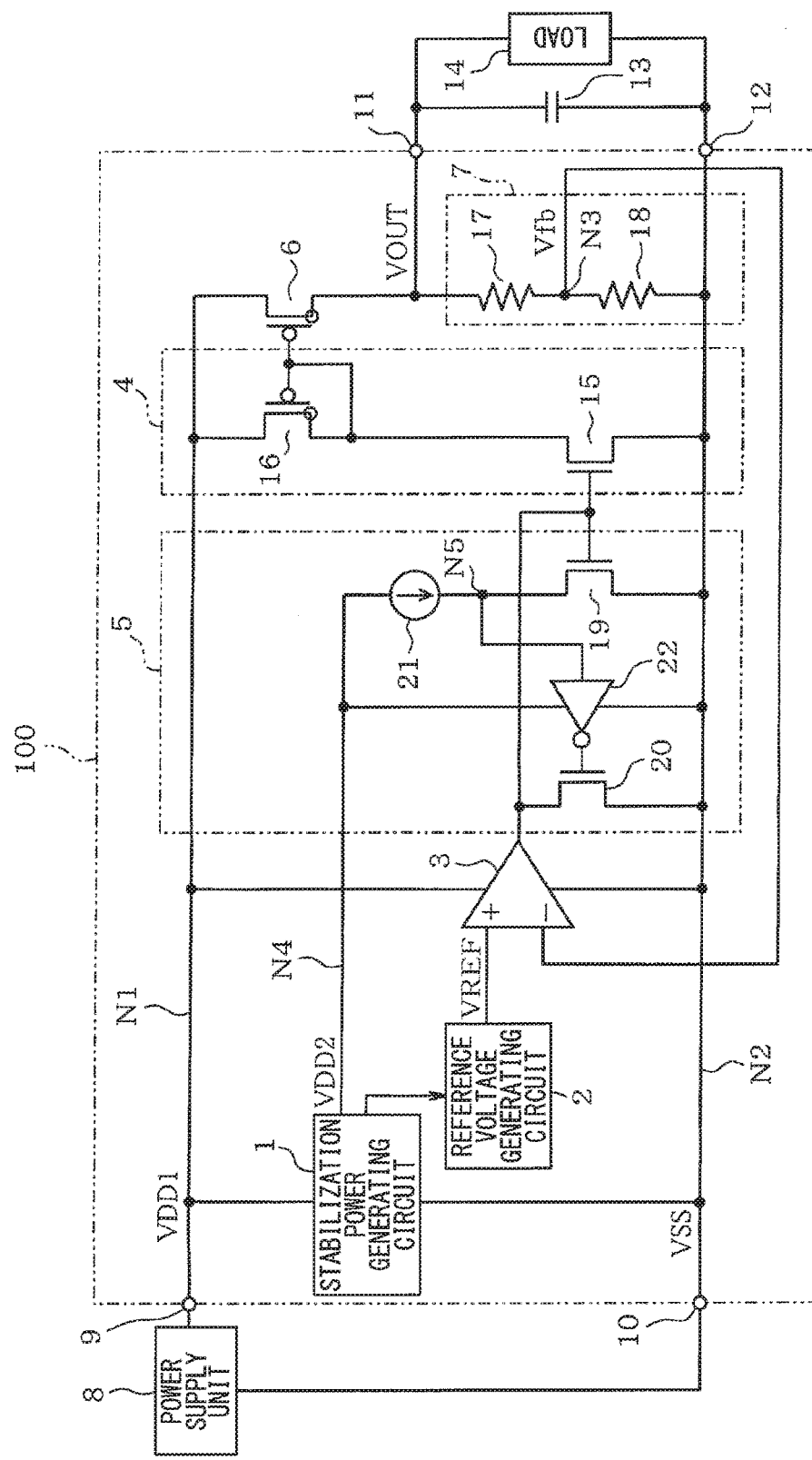
FIG. 1 is a diagram schematically showing an electrical structure of a regulator circuit according to a first embodiment.
Figure 2:
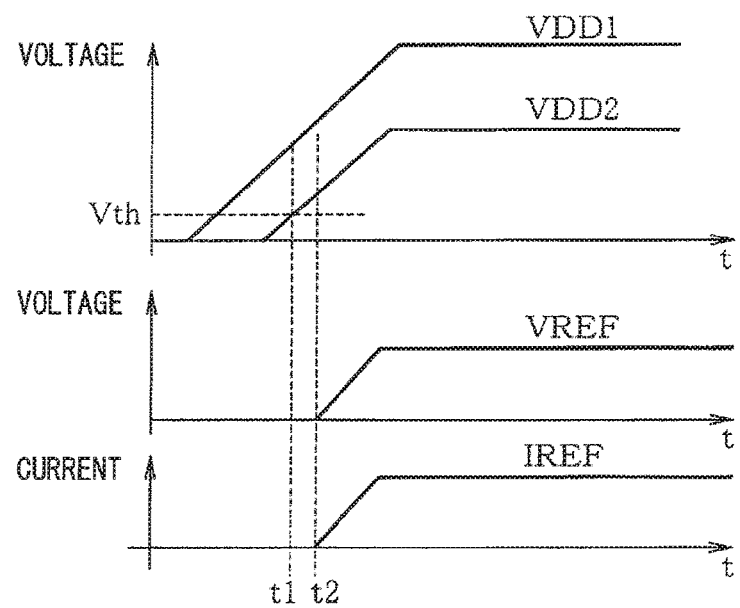
FIG. 2 is a timing chart schematically showing a voltage of each part at a startup.

FIG. 1 and FIG. 2 are explanatory diagrams of a first embodiment. As shown in FIG. 1, a regulator circuit 100 with a protection circuit includes a stabilization power generating circuit 1, a reference voltage generating circuit 2, an operational amplifier 3, a buffer stage 4, an overcurrent controlling circuit 5, a P-channel type MOS transistor 6 as an output transistor, and a feedback circuit 7. Hereinafter, the P-channel type MOS transistor 6 will be referred to as a PMOS transistor.

The regulator circuit 100 has a first power line (also referred to as a first power node) N1 of a power terminal 9. The regulator circuit 100 operates by receiving a power voltage VDD1 to the first power line N1 from a power supply unit 8. The regulator circuit 100 outputs a constant voltage from an output terminal 11 based on the power voltage VDD1 (e.g., 20 [V]). The power voltage VDD1 is a voltage with reference to a reference potential VSS, which is 0 V. Hereinafter, unless otherwise noted, the other voltage (e.g., VDD2, VREF) is also a voltage with reference to the reference potential VSS.

A bypass capacitor 13 is connected between the output terminal 11 and an output terminal 12 of a ground line N2. The both ends of the bypass capacitor 13 are connected to a load 14. As such, a direct current (DC) voltage can be provided to the load 14.

For example, the stabilization power generating circuit 1 includes a bandgap reference (BGR) circuit. The stabilization power generating circuit 1 steps down the power voltage VDD1, which is supplied to the first power line N1 from the power supply unit 8, and generates a power voltage VDD2 (e.g., 3 V to 3.5 V). Then, the stabilization power generating circuit 1 supplies the generated voltage to a second power line N4. The power source supplied to the second power line N4 is employed as an operation power source of the overcurrent controlling circuit 5. The reference voltage generating circuit 2 generates a reference voltage VREF, which is less than the power voltage VDD2, for a reference from the power voltage VDD2. Then, the reference voltage generating circuit 2 outputs the reference voltage VREF to a non-inversion input terminal of the operational amplifier 3. The reference voltage generating circuit 2 may generate the reference voltage VREF, which is less than the power voltage VDD2, for the reference from the power voltage VDD1.

The operational amplifier 3 operates by the power voltage VDD1, which is supplied from the power supply unit 8. The operational amplifier 3 compares the reference voltage VREF, which is generated by the reference voltage generating circuit 2, and a feedback voltage Vfb, which is fed back by the feedback circuit 7, and outputs a comparison result from the output terminal 11. The operational amplifier 3 outputs a signal to the output terminal 11 so as to accord the feedback voltage Vfb with the reference voltage VREF.

The operational amplifier 3 has an output terminal connected to the buffer stage 4. The buffer stage 4 includes an N-channel type MOS transistor 15 and a P-channel type MOS transistor 16. Hereinafter, the N-channel type MOS transistor 15 will be referred to as an NMOS transistor and the P-channel type MOS transistor 16 will be referred to as a PMOS transistor. The NMOS transistor 15 has a gate connected to the output terminal of the operational amplifier 3. The PMOS transistor 16 is connected in series to a drain-source path of the NMOS transistor 15 between a drain and a source of the NMOS transistor 15. The NMOS transistor 15 corresponds to a first transistor and the PMOS transistor 16 corresponds to a second transistor. The gate of the NMOS transistor 15 corresponds to a control terminal and the drain-source path of the NMOS transistor 15 corresponds to a main energization path.

The output terminal of the operational amplifier 3 is connected to the gate of the NMOS transistor 15. The drain-source path of the NMOS transistor 15 is applied with a current according to a control signal output from the operational amplifier 3. Between the first power line N1 and the ground line N2, a drain-source path of the PMOS transistor 16 and the drain-source path of the NMOS transistor 15 are connected in series with each other. The gate and the drain of the PMOS transistor 16 are commonly connected.

The PMOS transistor 6 is connected to the PMOS transistor 16 to form a current mirror. The gate of the PMOS transistor 16 of the buffer stage 4 and the gate of the PMOS transistor 6 are commonly connected. Each gate corresponds to a control terminal. The drain-source path of the PMOS transistor 6 is connected between the first power line N1 and the output terminal 11. The drain-source path of the PMOS transistor 6 corresponds to a main energization path of the PMOS transistor 6.

The PMOS transistor 16 and the PMOS transistor 6 have a structure different from the other transistor (e.g., the NMOS transistor 15). The PMOS transistor 16 and the PMOS transistor 6 include an oxide film having a constant thickness, and a distance between the gate and the drain is greater than the other transistor. The PMOS transistor 16 of the buffer stage 4 and the PMOS transistor 6 have drain voltage resistances greater than the other transistor (e.g., the NMOS transistor 15).

The feedback circuit 7 is connected between the output terminal 11 of the regulator circuit 100 and the ground line N2. For example, the feedback circuit 7 includes a resistor 17 and a resistor 18 that are connected in series with each other between the output terminal 11 and the ground line N2. The feedback circuit 7 feeds back a voltage of a node N3 between the resistor 17 and the resistor 18 to an inversion input terminal of the operational amplifier 3.

The output terminal of the operational amplifier 3 is connected to the overcurrent controlling circuit 5. The overcurrent controlling circuit 5 includes an N-channel type MOS transistor 19, an N-channel type MOS transistor 20, a current source 21 and a NOT gate (i.e., inverter) 22. The N-channel type MOS transistor 19 corresponds to an overcurrent detection transistor. The N-channel type MOS transistor 20 corresponds to a disconnection transistor. The current source 21 corresponds to an energization circuit. Hereinafter, the N-channel type MOS transistor 19 will be referred to as an NMOS transistor and the N-channel type MOS transistor 20 will be referred to as an NMOS transistor.

The current source 21 and the drain-source path of the NMOS transistor 19 are connected in series with each other between the second power line N4 and the ground line N2 of the stabilization power generating circuit 1. The current source 21 and the drain of the NMOS transistor 19 are commonly connected to a node N5 and a signal of the node N5 is input to the NOT gate 22. The NOT gate 22 operates by the power voltage VDD2 of the stabilization power generating circuit 1 and an output of the NOT gate 22 is input to the gate of the NMOS transistor 20.

The drain-source path of the NMOS transistor 20 is connected between the output terminal of the operational amplifier 3 and the ground line N2. The overcurrent controlling circuit 5 allows an on-operation of the NMOS transistor 20 and controls the output of the operational amplifier 3 to the potential VSS, which corresponds to the reference potential, of the ground line N2.

Effects of the above structure will be described.

<Normal State>

First, an operation in a normal state in which the power source is stably supplied will be described for convenience. In the normal state, the stabilization power generating circuit 1 generates the power voltage VDD2 from the power voltage VDD1. In this case, the current source 21 generates a constant current from the power voltage VDD2 and charges an input capacitance of the NOT gate 22 with the constant current. The input of the NOT gate 22 becomes "H" level and the NOT gate 22 outputs "L". As a result, the NMOS transistor 20 is turned off.

The output of the operational amplifier 3 is directly output to the gate of the NMOS transistor 15 included in the buffer stage 4. For example, when the reference voltage VREF, which is output from the reference voltage generating circuit 2, is greater than the feedback voltage Vfb, the operational amplifier 3 outputs high voltage to the gate of the NMOS transistor 15 and the NMOS transistor 15 energizes a current in the drain-source path according to the gate voltage.

When the drain-source path of the NMOS transistor 15 is energized, the drain current of the PMOS transistor 16 is drawn and the source-drain path of the PMOS transistor 16 is energized. Accordingly, the source-drain path of the PMOS transistor 6 is also energized. In this case, the current flowing in the resistor 17 and the resistor 18 of the feedback circuit 7 increases.

When the current flowing in the resistor 17 and the resistor 18 of the feedback circuit 7 increases and an output voltage VOUT reaches a target voltage, the feedback voltage Vfb of the feedback circuit 7 approaches the reference voltage VREF of the reference voltage generating circuit 2 and the output of the operational amplifier 3 decreases. Accordingly, the current flowing in the drain-source path of the NMOS transistor 15 decreases and the current flowing from the first power line N1 of the power voltage VDD1 to the drain-source path of the PMOS transistor 6 also decreases. According to a value of a consumption current of the load 14, the output voltage VOUT increases and decreases, and the output of the operational amplifier 3 also increases and decreases. As such, the output voltage VOUT is controlled to the target voltage.

(A) Descriptions of Comparative Example

For example, the inventors considered a structure in which the PMOS transistor 6 as a posterior stage output is connected to the output terminal of the operational amplifier 3, and the bypass capacitor 13 is connected posterior to the PMOS transistor 6. However, when a capability of outputting a current is increased, a device size of the PMOS transistor 6 is likely to be increased, and the gate of the PMOS transistor 6 is likely to be enlarged Therefore, there is a possibility that large parasitic capacitance is generated at the gate node.

In this case, an input resistance value of the output node of the operational amplifier 3 corresponds to a gate resistance (up to 1 MΩ) of the PMOS transistor 6, that is, increased. A pole (i.e., cut-off frequency) of the gate node of the PMOS transistor 6 is generated at a low frequency region. The pole of the PMOS transistor 6 is not separated from a pole (i.e., cut-off frequency) of the bypass capacitor 13 and a phase margin is decreased. Accordingly, there is a possibility that the circuit cannot suitably operate as a whole.

(B) Effects of Inserting Buffer Stage of Present Embodiment

In the present embodiment, the buffer stage 4 is provided. Since the PMOS transistor 16 of the buffer stage 4 is connected like a diode, the output resistance of the PMOS transistor 16 has a value dividing one by a mutual conductance of the PMOS transistor 16. Accordingly, the pole (i.e., cut-off frequency) of the gate node of the PMOS transistor 6 is generated at a high frequency region. The pole (i.e., cut-off frequency) of the bypass capacitor 13 is generated in the low frequency region. Therefore, the influence of the PMOS transistor 6 and the bypass capacitor 13 is easily separated.

The device size of the NMOS transistor 15 is preferably as small as possible. In this case, the parasitic capacitance of the gate of the NMOS transistor 15 is decreased. As a result, the pole (i.e., cut-off frequency) of the gate node of the NMOS transistor 15 is increased as much as possible. Furthermore, sufficient phase margin is secured to operate the circuit stably. When the size of the NMOS transistor 15 is sufficiently decreased, the pole of the gate node of the NMOS transistor 15 has a quite high frequency (e.g., equal to or greater than 3rd pole) and the phase margin is not affected.

<State in which Overcurrent is Applied (Short-Circuited State of Load)>

The state in which the load 14, which is connected to the output terminal 11, is short-circuited due to some cause.

When the load 14 is short-circuited, a large current flows to the ground line N2 from the output terminal 11 through the source-drain path of the PMOS transistor 6 and the gate voltage of the output PMOS transistor 6 is decreased. When the gate voltage of the output PMOS transistor 6 is decreased, the mirror current flowing in the source-drain path of the PMOS transistor 6 is increased. Then, the gate voltage of the NMOS transistor 15 of the buffer stage 4 is increased and the drain-source current of the NMOS transistor 19 is also increased.

Since the output current of the current source 21 is constant, when the drain-souse current of the NMOS transistor 19 is increased, charges stored in the input capacitance of the NOT gate 22 is discharged through the drain-source path of the NMOS transistor 19. As a result, the input of the NOT gate 22 becomes less than a threshold value from "H" to "L", and the NOT gate 22 outputs "H" level.

Then, the NMOS transistor 20 is turned on and the drain-source path of the NMOS transistor 20 is energized. The NMOS transistor 20 is subjected to the feedback control so that the current flowing in the current source 21 and the drain current flowing in the NMOS transistor 19 are balanced. As a result, the output voltage of the operational amplifier 3 is controlled to a predetermined control voltage according to the feedback control. The overcurrent is controlled, for example, even when the terminals of the load 14 are short-circuited due to some cause. Accordingly, the regulator circuit 100 is accurately protected.

<Startup State>

Next, an operation in a startup state will be described.

FIG. 2 is a timing chart schematically showing variations of voltage and current of main parts in the startup state. When the power supply unit 8 starts to input the power voltage VDD1 to the regulator circuit 100, the stabilization power generating circuit 1 starts to generate stabilized power voltage VDD2. In this case, the stabilization power generating circuit 1 generates the power voltage VDD2, which is less than the power voltage VDD1, by using the power voltage VDD1.

When the power voltage VDD2 reaches the stable operation voltage value of the current source 21 and the predetermined voltage corresponding to the stable operation voltage value of the NOT gate 22, and the power voltage VDD1 supplies the current to the output terminal 11 through the PMOS transistor 6, the voltage is output from the output terminal 11 through the PMOS transistor 6 after the overcurrent controlling circuit 5 starts to operate normally.

In this case, the overcurrent controlling circuit 5 operates without any incident because the overcurrent controlling circuit 5 operates before the output voltage VOUT is output. As described above, the overcurrent is detected as usual when the load 14 is short-circuited and the output of the operational amplifier 3 is connected to the node of the ground line N2 to be protected from the overcurrent.

Generally, the power voltage VDD2 increases after the increase of the power voltage VDD1 (see FIG. 2). When the power voltage VDD2 is activated after the power voltage VDD1, the overcurrent controlling circuit 5 does not operate normally until the stabilization power generating circuit 1 outputs, as the power voltage VDD2, the voltage allowing the energization of the drain-source path of the NMOS transistor 19 for the overcurrent control.

The reference voltage VREF is preferably activated after the stabilization power generating circuit 1 stably outputs the power voltage VDD2. Specifically, the stabilization power generating circuit 1 preferably operates to show a temporal relationship shown in FIG. 2.

When the NOT gate 22 outputs "H" level and the NMOS transistor 20 is turned-on, the overcurrent controlling circuit 5 performs the feedback control so as to balance the current of the current source 21 and the drain current of the NMOS transistor 19. As a result, the output voltage of the operational amplifier 3 is also controlled to the predetermined control voltage according to the feedback control.

The NOT gate 22 uses, as a power source, the power voltage VDD2 generated by the stabilization power generating circuit 1. When the power voltage VDD2 is greater than a threshold voltage Vth of the NMOS transistor 20 for the overcurrent control, the NMOS transistor 20 is turned-on as usual. The NMOS transistor 20 is turned-on as usual after a time point t1 of FIG. 2.

Namely, when the power voltage VDD2, which is generated by the stabilization power generating circuit 1, exceeds the predetermined threshold voltage Vth, that is, the lowest operation voltage (around Vth) of the NOT gate 22 (i.e., inverter), the NOT gate 22 is suitably applied with the power source and the NOT gate 22 operates as usual (after the time point t1).

When the reference voltage generating circuit 2 starts to output the reference voltage VREF and the current source 21 starts to output a reference current IREF, the control of the output of the operational amplifier 3 is started and the gate voltage of the NMOS transistor 15 is increased (at a time point t2). Since the feedback voltage Vfb and the output voltage VOUT increases after the reference voltage generating circuit 2 is activated, the overcurrent does not flow into the bypass capacitor 13 before the time point t1.

After the time point t2, the current flows in the drain-source path of the NMOS transistor 15 and the source-drain path of the PMOS transistor 16, and the voltage of the output terminal 11 increases. Even when the terminals of the load 14 are short-circuited, similarly to the above described overcurrent control operation, the feedback control is performed so as to balance the current of the current source 21 and the drain current of the NMOS transistor 19. The output voltage of the operational amplifier 3 is also controlled to the predetermined control voltage according to the feedback control. Accordingly, the regulator circuit 100 is protected from the overcurrent. Therefore, the regulator circuit 100 is protected from the overcurrent in the startup state of the power voltage VDD1.

<Descriptions of Comparative Art (Conventional Art)>

Conventionally, it has been known that an output current flowing from an output terminal is monitored by using a sense transistor and a sense resistor and the control transistor is driven by a voltage generated according to the output current. In this general structure, accuracy of the current detection processing and accuracy of the control based on the detection processing are degraded due to tolerance, temperature characteristics and the like, even in a normal state. Furthermore, in the state where the overcurrent occurs, the accuracy is degraded by variation of the power voltage VDD1 caused by variation of an output impedance of the power supply unit 8. In a current comparing method, the accuracy is improved by decreasing a resistor or using a current comparator. However, there is a possibility that the circuit area is increased because the number of transistors is increased.

According to the present embodiment, the buffer stage 4 is connected to the output terminal of the operational amplifier 3. Even when the size of the PMOS transistor 16 and the reference voltage generating circuit 2 is large, sufficient phase margin is secured, and thus the regulator circuit 100 operates stably.

The current flowing in the first power line N1 is detected by the NMOS transistor 19. The overcurrent controlling circuit 5 applies the output of the operational amplifier 3 to the NMOS transistor 19 and allows a normal operation of the NMOS transistor 19 when the detected current flowing in the first power line N1 is less than the predetermined value. The overcurrent controlling circuit 5 control the output of the operational amplifier 3 when the current flowing in the first power line N1 is equal to or greater than the predetermined value.

In the above described example, the current source 21 of the overcurrent controlling circuit 5 is connected, as the energization circuit, in series with the main energization path of the NMOS transistor 19 for detecting the overcurrent and the overcurrent controlling circuit 5 includes the current source 21. The overcurrent controlling circuit 5 charges the input capacitance of the NOT gate 22 with a difference current obtained by subtracting a current flowing in the NMOS transistor 19 from a current flowing in the current source 21. When a voltage charged with the difference current becomes equal to or greater than a predetermined voltage, the overcurrent controlling circuit 5 allow the normal operation of the NMOS transistor 19.

When the overcurrent flows in the first power line N1, for example, due to the short-circuit of the terminals of the load 14, the voltage charged with the difference current becomes less than the predetermined voltage and the overcurrent controlling circuit 5 performs a pull-down control of the output of the operational amplifier 3. Then, the regulator circuit 100 repeats the energization and disconnection of the current to restore the current to a predetermined operation point and thus controls the overcurrent. Accordingly, the overcurrent control is performed to protect the regulator circuit 100, for example, even when the terminals of the load 14 are short-circuited due to some cause.

In the present embodiment, the first power line N1 of the power voltage VDD1, which is supplied from the power supply unit 8, and the second power line (second power node) N4 of the power voltage VDD2, which is generated by and output from the stabilization power generating circuit 1, are separated. In the startup state, the time point from which the power voltage VDD2 starts to increase may be earlier and later than the time point from which the power voltage VDD1 starts to increase.

In the present embodiment, the reference voltage generating circuit 2 starts to output the reference voltage VREF after the stabilization power generating circuit 1 outputs, as the power voltage VDD2, the voltage greater than the predetermined threshold voltage Vth, that is, the voltage greater than the lowest operation voltage of the NOT gate 22 (e.g., almost Vth). Namely, the reference voltage generating circuit 2 starts to output the reference voltage VREF after the stabilization power generating circuit 1 outputs the voltage that enables the overcurrent controlling circuit 5 to operate stably. Even when there is a time lag between the power voltage VDD1 and the power voltage VDD2 in the startup state, the regulator circuit 100 is protected.

The voltage resistances of the PMOS transistor 16 and the drain-source path of the PMOS transistor 6 are greater than the voltage resistance of the drain-source path of the NMOS transistor 15. Therefore, the voltage resistance of the regulator circuit 100 against the power voltage VDD1 is improved.

Since the regulator circuit 100 includes the buffer stage 4, the power supply unit 8, which is employed as the main power source of the regulator circuit 100, and the stabilization power generating circuit 1, which is employed for detecting and controlling the overcurrent, are separated.

Even when the power voltage VDD1, which is supplied from the power supply unit 8, is high, the overcurrent controlling circuit 5 does not necessarily include an element having high voltage resistance because the stabilization power generating circuit 1 other than the power supply unit 8 is employed for generating the power voltage VDD2. Therefore, the area of the structure of the overcurrent controlling circuit 5 is decreased. Since the stabilization power generating circuit 1 generates the power voltage VDD2, the overcurrent controlling circuit 5 operates with the power voltage VDD2, which is more stable than the power voltage VDD1. Accordingly, the overcurrent is more accurately detected and controlled.

First Modification of First Embodiment

Figure 3:
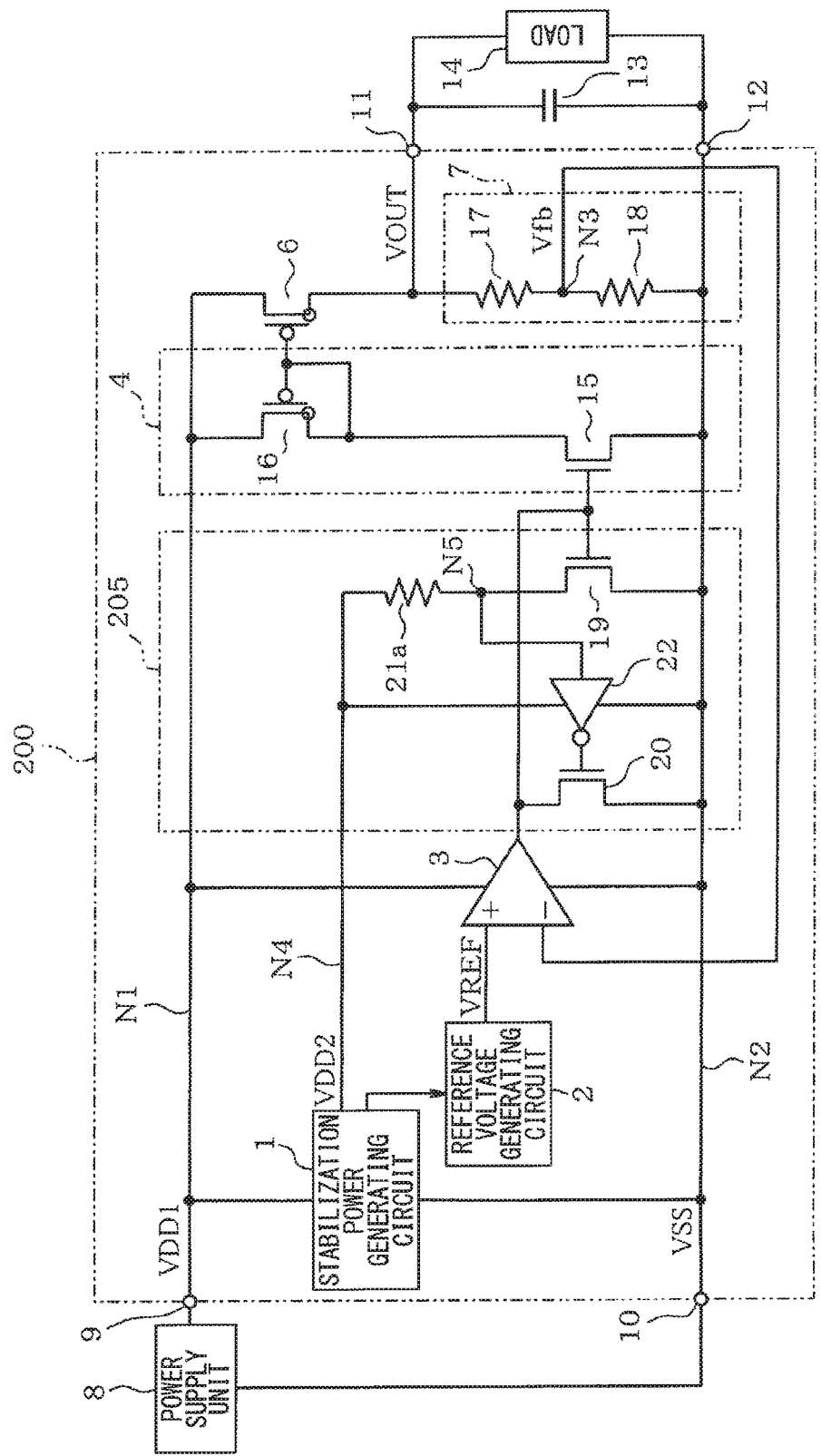
FIG. 3 is a diagram schematically showing an electrical structure of a regulator circuit according to a first modification of the first embodiment.

FIG. 3 is an additional explanatory diagram showing a first modification of the first embodiment. As shown in FIG. 3, a 200 includes a resistor 21a as the energization circuit instead of the current source 21. When the regulator circuit 200 includes the resistor 21a, the input capacitance of the NOT gate 22 is charged by energizing the resistor 21a. When the amount of the energized current of the second power line N4 is greater than a predetermined value, the input capacitance of the NOT gate 22 is charged through the resistor 21a.

When the charged voltage of the input capacitance of the NOT gate 22 becomes greater than a predetermined voltage, the logic of the NOT gate 22 is inversed. According to the first modification, the effects similar to the first embodiment are achieved.

Second Modification of First Embodiment

Figure 4:
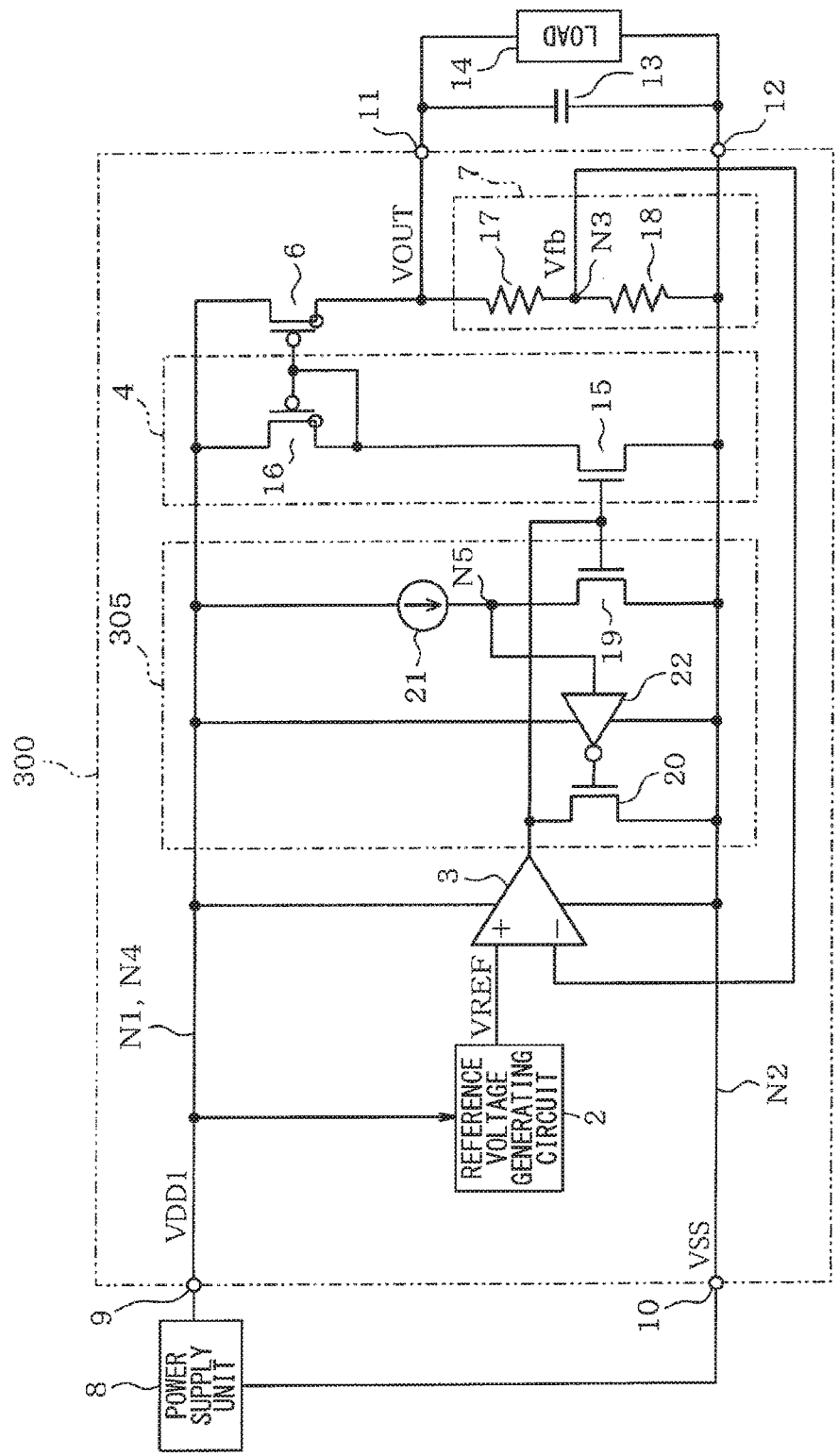
FIG. 4 is a diagram schematically showing an electrical structure of a regulator circuit according to a second modification of the first embodiment.

FIG. 4 is an additional explanatory diagram of a second modification of the first embodiment. As shown in FIG. 4, a regulator circuit 300 includes an overcurrent controlling circuit 305. The regulator circuit 300 may have a structure without the stabilization power generating circuit 1 as shown in FIG. 4.

Compared to the structure of the first embodiment, the second power line N4 is connected to the first power line N1, that is, the second power line N4 and the first power line N1 are included in the same electrical node. The power supply unit 8 supplies the power voltage VDD1 to the electrical node N1 and supplies the power voltage of the NOT gate 22 and the current source 21 from the power voltage VDD1. When abnormality such as the short-circuit of the load 14 occurs in a steady state, the regulator circuit 300 operates similarly to the first embodiment. Therefore, the effects similar to the first embodiment are achieved.

Also in the second modification, the reference voltage generating circuit 2 starts to output the reference voltage VREF after the power supply unit 8 outputs, to the first power line N1 as the power voltage VDD2, the voltage greater than the predetermined threshold voltage Vth, that is, the voltage greater than the lowest operation voltage of the NOT gate 22 (inverter). Namely, the reference voltage generating circuit 2 starts to output the reference voltage VREF after the power supply unit 8 outputs the voltage that enables the overcurrent controlling circuit 5 to operate stably. Accordingly, the regulator circuit 300 operates similarly to the first embodiment in the startup state. Therefore, the effects similar to the first embodiment are achieved.

Second Embodiment

Figure 5:
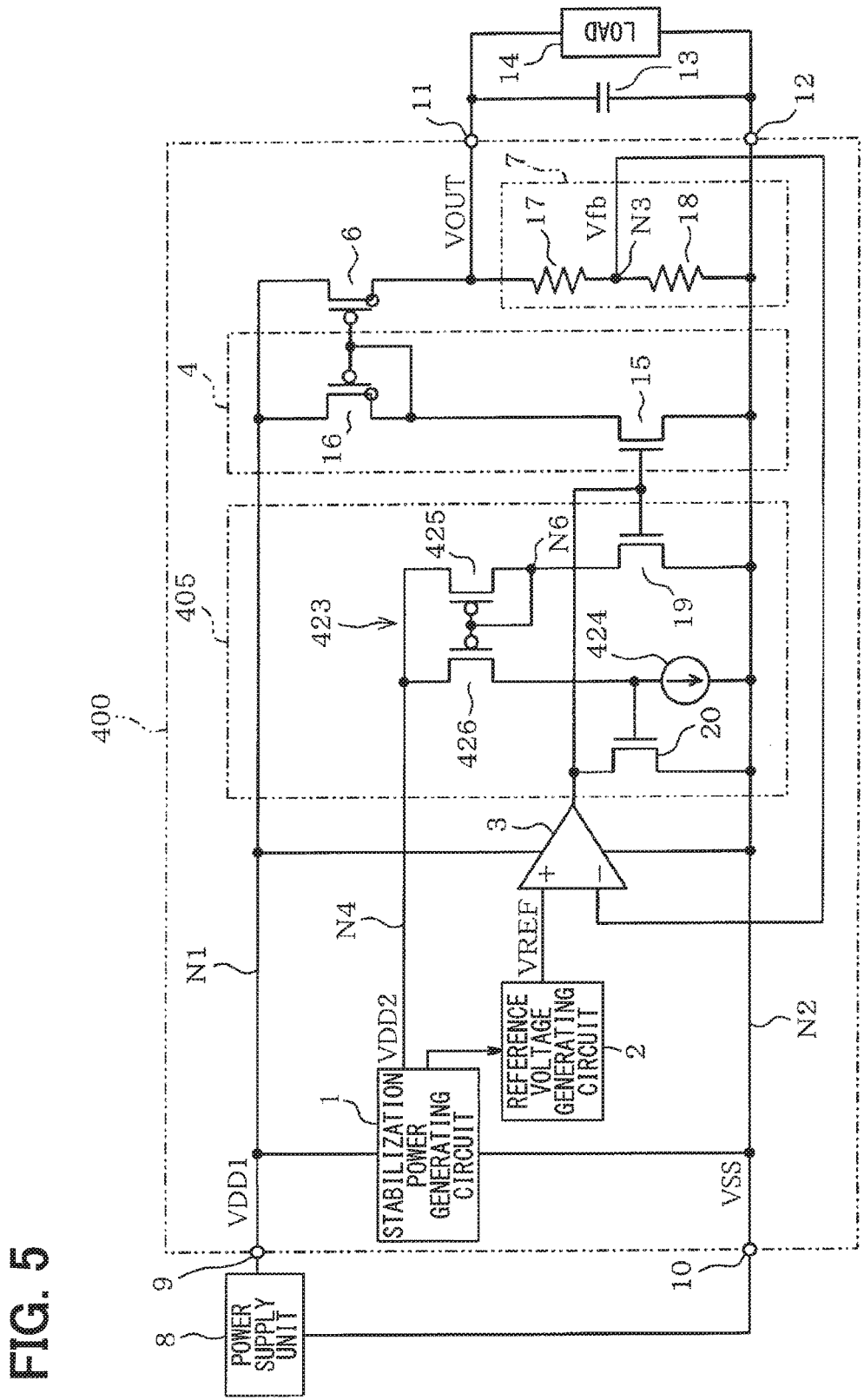
FIG. 5 is a diagram schematically showing an electrical structure of a regulator circuit according to a second embodiment.

FIG. 5 is an additional explanatory diagram of a second embodiment. The second embodiment is different from the first embodiment in a structure of the overcurrent controlling circuit. As shown in FIG. 5, a regulator circuit 400 includes an overcurrent controlling circuit 405. As shown in FIG. 5, the overcurrent controlling circuit 405 includes an NMOS transistor 19 as an overcurrent detection transistor, an NMOS transistor 20 for pulling down the output of the operational amplifier 3, a current mirror circuit 423, and a current source 424 as an energization circuit.

The current mirror circuit 423 is provided by a pair of a PMOS transistor 425 as an input transistor and a PMOS transistor 426 as an output transistor. The PMOS transistor 425 is connected in an energization path from the second power line N4 to the drain of the NMOS transistor 19. The gate and the drain of the PMOS transistor 425 are commonly connected to a node N6 and the node N6 is connected to the drain of the NMOS transistor 19. The gate of the PMOS transistor 425 and the gate of the PMOS transistor 426 are commonly connected to each other. The source of the PMOS transistor 425 and the source of the PMOS transistor 426 are commonly connected to the ground line N2.

The drain of the PMOS transistor 426, which is located at an output side of the current mirror circuit 423, is connected to the current source 424 and the gate of the NMOS transistor 20. The current source 424 generates a constant current from the power voltage VDD2, which is generated by the stabilization power generating circuit 1. The current source 424 is connected to draw the output current of the PMOS transistor 426 of the current mirror circuit 423. The drain of the NMOS transistor 20 is connected to the output terminal of the operational amplifier 3 and the source of the NMOS transistor 20 is connected to the ground line N2. Since the other configurations are similar to the first embodiment, the descriptions thereof will not be repeated.

In the above configuration, the overcurrent threshold is set according to a size ratio of the NMOS transistor 15 and the NMOS transistor 19, a size ratio of the PMOS transistor 425 and the PMOS transistor 426, and a value of the constant current of the current source 424.

Effects of the above configuration will be described.

<Normal State>

In the normal state, the stabilization power generating circuit 1 generates the power voltage VDD2 and outputs the power voltage VDD2 as a current source for the current mirror circuit 423. The current source 424 energizes the constant current. In the normal state, when the operational amplifier 3 drives the gate of the NMOS transistor 15, the operational amplifier 3 also drives the gate of the NMOS transistor 19 to allow the current flowing through the drain of the PMOS transistor 425 of the current mirror circuit 423. The current source 424 draws the mirror current flowing in the PMOS transistor 426 of the current mirror circuit 423. As a result, the drain-source path of the NMOS transistor 20 is in an open state and the output of the operational amplifier 3 is energized to the gate of the NMOS transistor 15 of the buffer stage 4 as usual. Accordingly, similarly to the first embodiment, the feedback control of the output voltage VOUT is performed according to the variation of the current flowing in the resistor 17 and the resistor 18 of the feedback circuit 7, and the output voltage VOUT is controlled to the target voltage.

<State in which Overcurrent is Applied (Short-Circuited State of Load>

When the terminals of the load 14 are short-circuited, a large current flows from the output terminal 11 to the ground line N2 through the source-drain path of the PMOS transistor 6. Simultaneously, similarly to the first embodiment, the gate voltage of the NMOS transistor 15 increases and the current flowing in the drain-source path of the NMOS transistor 19 also increases. The current mirror circuit 423 mirrors the drain-source current of the NMOS transistor 19 to energize the current source 424. When the current, which is greater than the constant current of the current source 424, is energized into the gate input capacitance of the NMOS transistor 20, the gate input capacitance is charged with the current and the gate voltage of the NMOS transistor 20 increases.

When the gate voltage of the NMOS transistor 20 exceeds the threshold voltage, the NMOS transistor 20 is turned on and the drain-source path of the NMOS transistor 20 is energized. The feedback control is performed so that the drain current of the PMOS transistor 426 of the current mirror circuit 423 and the current of the current source 424 are balanced, and the output voltage of the operational amplifier 3 is controlled to the predetermined control voltage according to the feedback control. Accordingly, the overcurrent is controlled, for example, even when the terminals of the load 14 are short-circuited due to some cause, and the regulator circuit 400 is accurately protected.

<Startup State>

Next, operations in the startup state will be described. In the present embodiment, the regulator circuit 400 includes the current mirror circuit 423. The overcurrent controlling circuit 405 normally operates with the lowest operation voltage that enables the current mirror circuit 423 and the like to operate in the startup state.

The lowest operation voltage of the current mirror circuit 423 is Vthp+Vovp+Vovn obtained by adding a threshold voltage Vthp of the PMOS transistor 425, an overdrive voltage Vovp of the PMOS transistor 425, and an overdrive voltage Vovn of the NMOS transistor 19. On the other hand, the lowest operation voltage of the NMOS transistor 20 is Vthn+Vovp obtained by adding a threshold voltage Vthn of the NMOS transistor 20 and an overdrive voltage Vovp of the PMOS transistor 426. When the stabilization power generating circuit 1 outputs the power voltage VDD2 greater than Vthp+Vovp+Vovn and Vthn+Vovp, the overcurrent controlling circuit 405 normally operates. Suppose that Vthn=Vthp, the overcurrent controlling circuit 405 is regulated by the lowest operation voltage Vthp+Vovp+Vovn of the current mirror circuit 423.

Preferably, the reference voltage generating circuit 2 starts to output the reference voltage VREF at a time point when the overcurrent controlling circuit 405 is engaged to operate normally. In this case, as described in the previous embodiments, the operation of the regulator circuit 400 in the startup state is secured.

According to the present embodiment, the overcurrent controlling circuit 405 includes the current mirror circuit 423 including the PMOS transistor 425 and the PMOS transistor 426. Even when the maximum value of the gate capacitance of the NMOS transistor 15 and the NMOS transistor 19 is limited, the overcurrent threshold is set by adjusting a mirror ratio of the NMOS transistor 15 and the NMOS transistor 19 and a mirror ratio of the PMOS transistor 425 and the PMOS transistor 426. That is, design flexibility is preserved. Although the current mirror circuit 423 folds back the current, a large current error is avoided by adjusting the layout of the current mirror circuit 423.

Instead of the current source 424, a non-illustrated resistor may be employed. For example, the current source 424 is not necessary when the overcurrent threshold does not require high accuracy.

Modification of Second Embodiment

Figure 6:
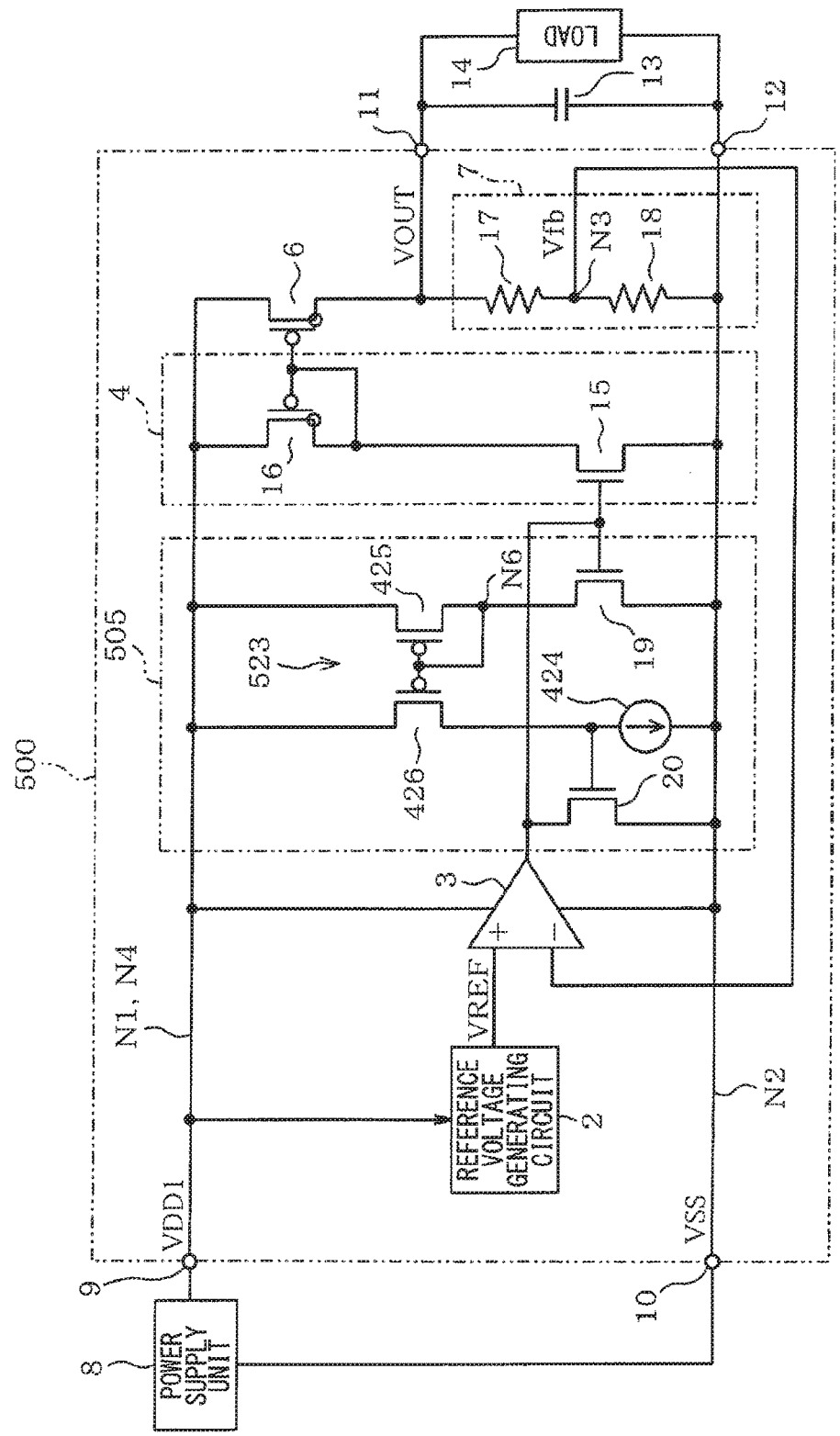
FIG. 6 is a diagram schematically showing an electrical structure of a regulator circuit according to a modification of the second embodiment.

FIG. 6 is an additional explanatory diagram of a modification of a second embodiment. As shown in FIG. 6, a regulator circuit 500 includes an overcurrent controlling circuit 505. The regulator circuit 500 may have a structure without the stabilization power generating circuit 1 as shown in FIG. 6.

Compared to the structure of the second embodiment shown in FIG. 5, the second power line N4 is connected to the first power line N1, that is, the second power line N4 and the first power line N1 are included in the same electrical node. The power supply unit 8 supplies the power voltage VDD1 to the electrical node and supplies power to the current mirror circuit 523 instead of the current mirror circuit 423 from the power voltage VDD1 (i.e., the operation power source of the overcurrent controlling circuit 505). When an abnormality such as the short-circuit of the terminals of the load 14 occurs in a steady state, the regulator circuit 500 operates similarly to the previous embodiments. Therefore, the effects similar to the previous embodiments are achieved.

Also in the present modification, the reference voltage generating circuit 2 outputs the reference voltage VREF after the power supply unit 8 outputs, as the power voltage VDD1, the voltage greater than the lowest operation voltage of the NMOS transistor 20 to the first power line N1. The regulator circuit 500 operates similarly to the first embodiment in the startup state. Therefore, the effects similar to the first embodiment are achieved.

Third Embodiment

Figure 7:
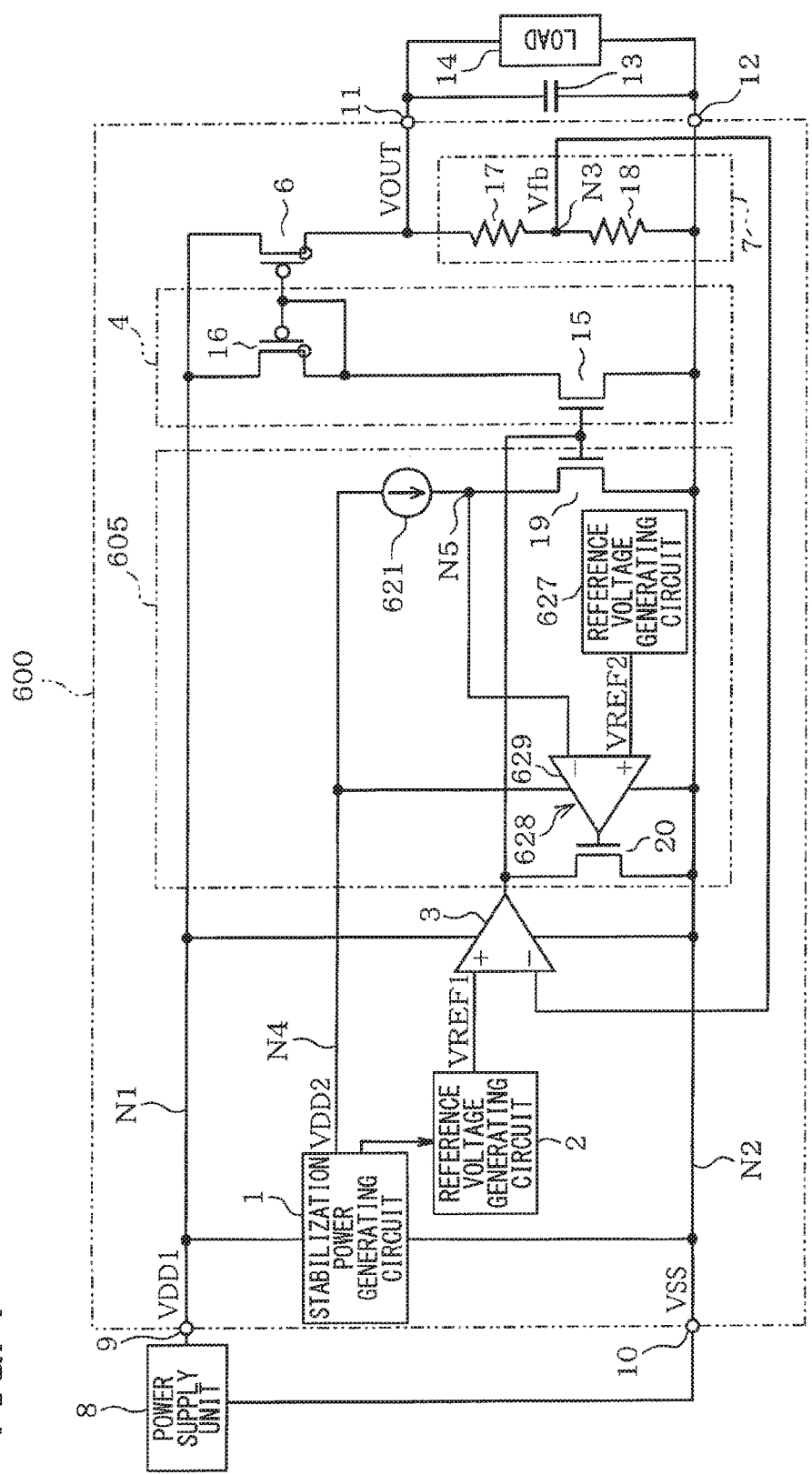
FIG. 7 is a diagram schematically showing an electrical structure of a regulator circuit according to a third embodiment.
Figure 8:
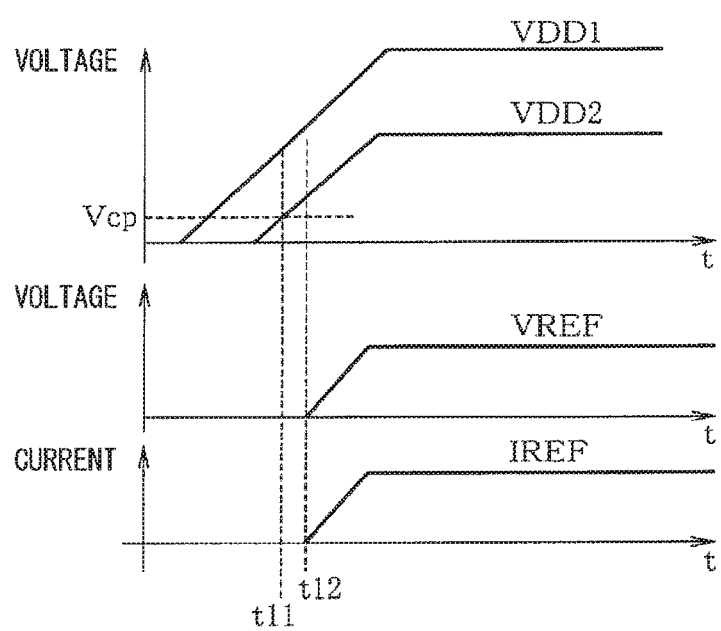
FIG. 8 is a timing chart schematically showing a voltage of each part at a startup.

FIG. 7 and FIG. 8 are additional explanatory diagrams of a third embodiment. As shown in FIG. 7, a regulator circuit 600 includes an overcurrent controlling circuit 605. As shown in FIG. 7, the overcurrent controlling circuit 605 includes an NMOS transistor 19, an NMOS transistor 20, a current source 621, a reference voltage generating circuit 627 and a comparator 628. For example, the comparator 628 is provided by an operational amplifier 629.

The reference voltage generating circuit 627 generates a reference voltage VREF2 and outputs the reference voltage VREF2 to a non-inversion input terminal of the operational amplifier 629. The overcurrent control threshold is arbitrarily set by the reference voltage generating circuit 627 varying the reference voltage VREF2. The current source 621 is connected between the second power line N4 of the power voltage VDD2, which is output from the stabilization power generating circuit 1, and the drain of the NMOS transistor 19.

The current source 621 and the drain of the NMOS transistor 19 are commonly connected to the node N5 and the node N5 is connected to an inversion input terminal of the operational amplifier 629. The operational amplifier 629 operates by receiving the power voltage VDD2 from the second power line N4. The operational amplifier 629 compares the voltage of the node N5 and the reference voltage VREF2, and outputs the comparison results to the gate of the NMOS transistor 20 as "H" level or "L" level.

In the normal state, the constant current of the current source 621 flows into the drain-source path of the NMOS transistor 20. The constant current of the current source 621 also flows into the input capacitance of the inversion input terminal of the operational amplifier 629, and the voltage of the inversion input terminal of the operational amplifier 629 is increased to be greater than the reference voltage VREF2. In this case, the operational amplifier 629 outputs "L" level. For example, when the short-circuit of the terminals of the load 14 occurs, the current flowing in the drain-source path of the NMOS transistor 15 and the NMOS transistor 19 is increased and the NMOS transistor 19 draws current from the input capacitance of the inversion input terminal of the operational amplifier 629.

As a result, the voltage of the node N5 is decreased to be less than the reference voltage VREF2, which is output by the reference voltage generating circuit 627. Similarly to the above embodiments, the NMOS transistor 20 is turned on and the feedback control is performed so that the current of the current source 621 and the drain current of the NMOS transistor 19 are balanced, and the output voltage of the operational amplifier 3 is controlled to the predetermined control voltage according to the feedback control.

FIG. 8 is a timing chart schematically showing the voltage of each part in the startup state. In the startup state, the stabilization power generating circuit 1 starts to output the predetermined threshold voltage as the power voltage VDD2 at a time point t11, and then the reference voltage generating circuit 2 starts to output the reference voltage VREF at a time point t12. The predetermined threshold voltage corresponds to the lowest operation voltage Vcp. Generally, the lowest operation voltage Vcp is greater than a threshold voltage Vth of a MOS transistor that is a voltage to turn on the NMOS transistor 20 and activate the overcurrent control function. Even when there is a time lag between the power voltage VDD1 and the power voltage VDD2 in the startup state, the regulator circuit 600 is protected.

In the present embodiment, the effects similar to the above embodiments are achieved. The reference voltage generating circuit 2 generates the reference voltage VREF2 and is capable of varying the reference voltage VREF2 as the voltage to be compared with the operational amplifier 629. Accordingly, the threshold for determining the overcurrent is easily set by adjusting the reference voltage VREF2.

When the power supply unit 8 and the stabilization power generating circuit 1 simultaneously activate the power voltage VDD1 and the power voltage VDD2, the regulator circuit 600 and the overcurrent controlling circuit 605 are simultaneously activated. Also in this case, the overcurrent control function is normally operated.

Modification of Third Embodiment

Figure 9:
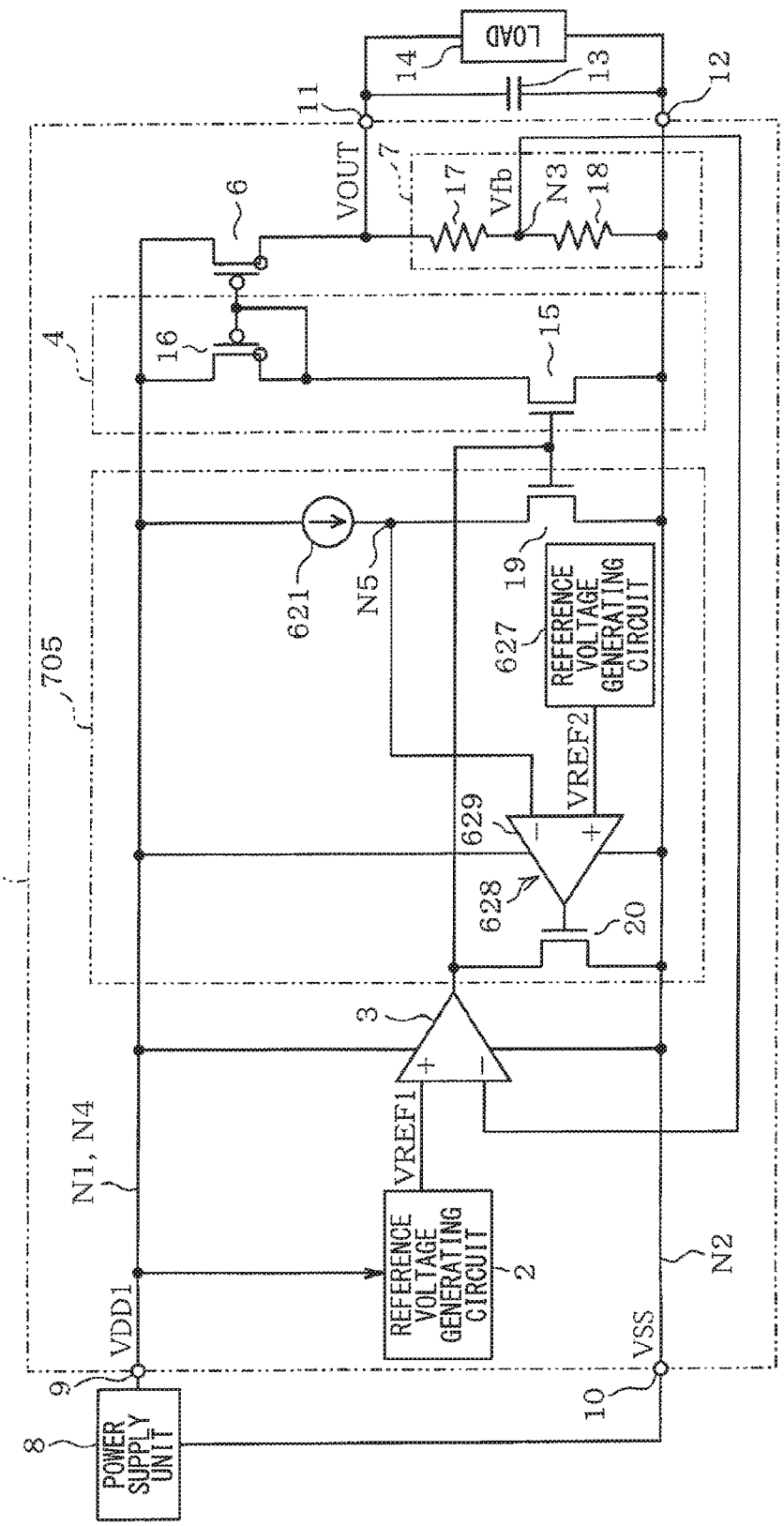
FIG. 9 is a diagram schematically showing an electrical structure of a regulator circuit according to a modification of the third embodiment.

FIG. 9 is an additional explanatory diagram of a modification of the third embodiment. As shown in FIG. 9, a regulator circuit 700 includes an overcurrent controlling circuit 705. The regulator circuit 700 may have a structure without the stabilization power generating circuit 1 as shown in FIG. 9.

Compared to the structure of the third embodiment shown in FIG. 7, the second power line N4 is connected to the first power line N1, that is, the second power line N4 and the first power line N1 are included in the same electrical node. The power supply unit 8 supplies the power voltage VDD1 to the electrical node, and supplies power voltage to the operational amplifier 629 (i.e., the comparator 628) and voltage to the current source 621 from the power voltage VDD1. When an abnormality such as the short-circuit of the terminals of the load 14 occurs in a steady state, the regulator circuit 700 operates similarly to the third embodiment. Therefore, the effects similar to the third embodiment are achieved.

Also in the present modification, the reference voltage generating circuit 2 starts to output the reference voltage VREF after the power supply unit 8 outputs the predetermined threshold voltage to the first power line N1 as the power voltage VDD1. The predetermined threshold voltage is a voltage that enables the overcurrent controlling circuit 705 to operate stably and is greater than the lowest operation voltage Vcp of the operational amplifier 629, which is shown in FIG. 8. The regulator circuit 700 operates similarly to the third embodiment in the startup state. Therefore, the effects similar to the third embodiment are achieved.

Fourth Embodiment

Figure 10:
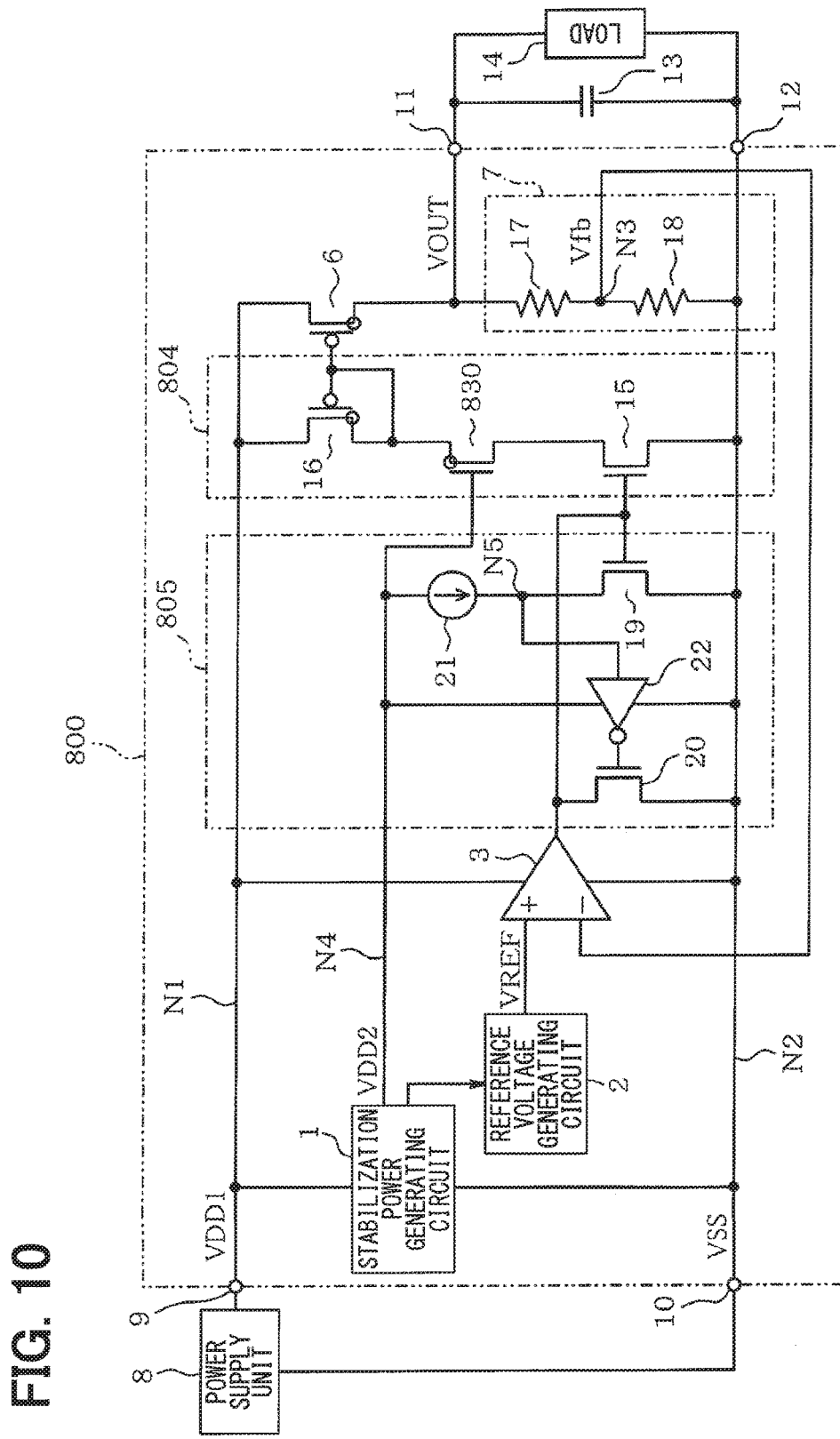
FIG. 10 is a diagram schematically showing an electrical structure of a regulator circuit according to a fourth embodiment.
Figure 11:
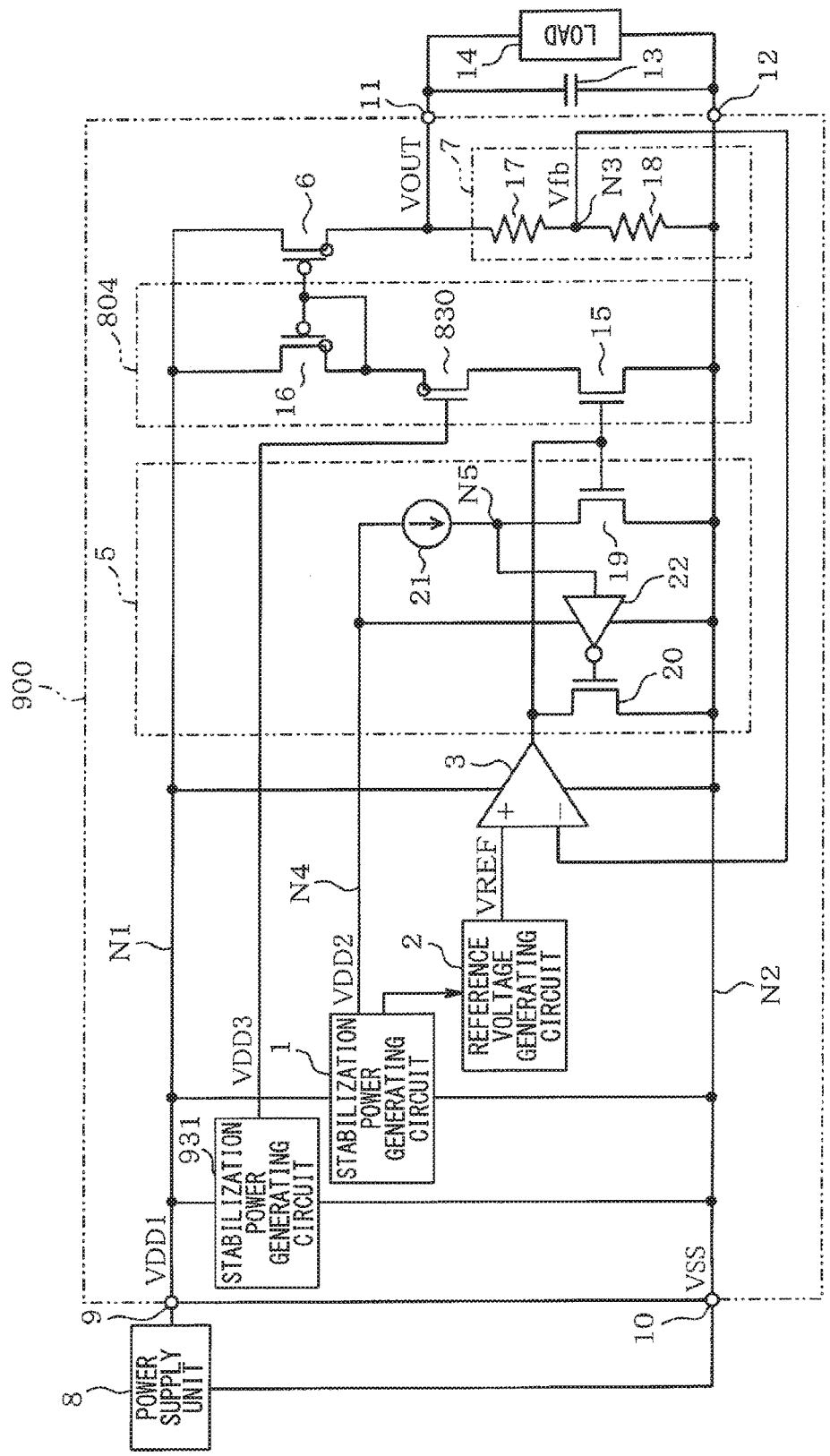
FIG. 11 is a diagram schematically showing an electrical structure of a regulator circuit according to a modification of the fourth embodiment.

FIG. 10 and FIG. 11 are additional explanatory diagrams of a fourth embodiment. In FIG. 10, the structure of the buffer stage 4 of FIG. 1 is changed to a cascode connection structure. A buffer stage 804 instead of the buffer stage 4 includes an NMOS transistor 15, a PMOS transistor 16, and an N-channel type MOS transistor 830. The N-channel type MOS transistor 830 corresponds to a third transistor. Hereinafter, the N-channel type MOS transistor 830 will be referred to as an NMOS transistor.

The buffer stage 804 includes the NMOS transistor 830 connected between the PMOS transistor 16 and the NMOS transistor 15 to form a cascode. For example, the NMOS transistor 830 is a high voltage resistance element having a width between the gate and the drain is greater than a width between the gate and the drain of the other NMOS transistor 15. The NMOS transistor 830 is the high voltage resistance element similar to the PMOS transistor 16. The NMOS transistor 830 has voltage resistance increased at a region adjacent to the drain compared to the other transistor (e.g., the NMOS transistor 15). The gate of the NMOS transistor 830 receives the power voltage VDD2 from the stabilization power generating circuit 1. According to the configuration, effects similar to the above embodiments (e.g., the first embodiment) are achieved in the steady state and in the startup state.

Modification of Fourth Embodiment

In the regulator circuit 800 shown in FIG. 10, the gate of the NMOS transistor 830 receives the stabilized power voltage VDD2. However, the present disclosure is not limited to the example. As shown in FIG. 11, a regulator circuit 900 may include another stabilization power generating circuit 931 and the gate of the NMOS transistor 830 may receive an output voltage VDD3, which is, for example, equal to VDD2, of the stabilization power generating circuit 931.

Other Embodiment

For example, in the structure of some embodiments in which the stabilization power generating circuit 1 is not provided and the power supply unit 8 supplies the operation power of the overcurrent controlling circuit, the reference voltage generating circuit 2 preferably starts to output the reference voltage VREF after the power supply unit 8 outputs the power voltage VDD1, which enables the overcurrent controlling circuit to stably operate, to the first power line N1.

Although the comparator 628 includes the operational amplifier 629, the comparator 628 may include a comparator instead of the operational amplifier 629.

In a Power Line Communication (PLC), signals are superimposed on the first power line N1. In this case, when the overcurrent flows in the source-drain path of the PMOS transistor 6, the overcurrent is controlled similarly to the above embodiments.

In the drawings, the symbol 1 indicates the stabilization power generating circuit, the symbol 2 indicates the reference voltage generating circuit, and the symbol 3 indicates the operational amplifier. The symbols 4 and 804 indicate the buffer stage. The symbols 5, 205, 305, 405, 505, 605, 705 and 805 indicate the overcurrent controlling circuit. The symbol 6 indicates the P-channel type MOS transistor (i.e., the output transistor). The symbol 7 indicates the feedback circuit. The symbol 8 indicates the power supply unit, the symbol 9 indicates the power terminal, and the symbol ii indicates the output terminal. The symbol 15 indicates the N-channel type MOS transistor (i.e., the first transistor) and the symbol 16 indicates the P-channel type MOS transistor (i.e., the second transistor). The symbols 21 and 621 indicate the current source (i.e., the energization circuit). The symbol 21a indicates the resistor (i.e., the energization circuit). The symbols 423 and 523 indicate the current mirror circuit. The symbol 424 indicates the current source (i.e., the energization circuit). The symbol 425 indicates the P-channel type MOS transistor (i.e., the input transistor) and the symbol 426 indicates the P-channel type MOS transistor (i.e., the output transistor). The symbol 628 indicates the comparator, and the symbol 629 indicates the operational amplifier. The symbol 830 indicates the N-channel type MOS transistor (i.e., the third transistor). The symbol N1 indicates the power line, and the symbol N4 indicates the second power line. The symbols 100, 200, 300, 400, 500, 600, 700, 800 and 900 indicate the regulator circuit.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A regulator circuit that is configured to receive a power voltage from a power supply unit to a first power line and output a constant voltage from an output terminal according to a reference voltage, the regulator circuit comprising:
    a reference voltage generating circuit that is configured to generate the reference voltage;
    an operational amplifier that is configured to compare the reference voltage and a feedback voltage and output an op-amp output voltage from an op-amp output terminal, the feedback voltage being fed back according to the reference voltage and a regulator output voltage of the output terminal of the regulator circuit;
    a buffer stage that includes a first transistor and a second transistor, the first transistor having a control terminal connected to the op-amp output terminal, and the second transistor being connected in series to a first main energization path of the first transistor;
    an output transistor that is connected posterior to the buffer stage, is connected to the second transistor to form a current mirror, and has an output main energization path between the first power line and the output terminal of the regulator circuit;
    a feedback circuit that is connected in series to the output main energization path and is configured to output the feedback voltage according to the regulator output voltage; and
    an overcurrent controlling circuit that includes an overcurrent detection transistor having a control terminal commonly connected to the control terminal of the first transistor of the buffer stage and having a detection main energization path, wherein
    the overcurrent controlling circuit is configured to apply the op-amp output voltage to the control terminal of the first transistor and allow a normal operation of the first transistor when an energization current of the output main energization path, which is detected by the overcurrent detection transistor, is less than a predetermined value, and
    the overcurrent controlling circuit is configured to control the op-amp output voltage to a predetermined control voltage according to a detection current flowing in the detection main energization path when the energization current of the output main energization path is equal to or greater than the predetermined value.

2. The regulator circuit according to claim 1, wherein the overcurrent controlling circuit includes an energization circuit that is connected in series to the detection main energization path, the overcurrent controlling circuit is configured to apply the op-amp output voltage to the control terminal of the first transistor and allow the normal operation of the first transistor when a voltage charged with a difference current is equal to or greater than a predetermined voltage, the difference current being obtained by subtracting the detection current flowing in the overcurrent detection transistor from an energization circuit current flowing in the energization circuit, and the overcurrent controlling circuit is configured to control the op-amp output voltage to the predetermined control voltage so that the detection current and the energization circuit current are balanced when the voltage charged with the difference current is less than the predetermined voltage.

3. The regulator circuit according to claim 2, wherein the energization circuit of the overcurrent controlling circuit includes a current source that is connected in series to the detection main energization path.

4. The regulator circuit according to claim 2, wherein the overcurrent controlling circuit includes a comparator that is configured to compare the voltage charged with the difference current and a variable overcurrent threshold as the predetermined voltage.

5. The regulator circuit according to claim 1, wherein the overcurrent controlling circuit includes a current mirror circuit including an input transistor and an output transistor, the input transistor being connected to the detection main energization path, and the output transistor being connected to the input transistor to form a current mirror, the overcurrent controlling circuit includes an energization circuit that is connected to draw an output current of the current mirror circuit, the overcurrent controlling circuit is configured to apply the op-amp output voltage to the control terminal of the first transistor and allow the normal operation of the first transistor when a voltage charged with a difference current is less than a predetermined voltage, the difference current being obtained by subtracting an energization circuit current flowing in the energization circuit from the output current of the current mirror circuit, and the overcurrent controlling circuit is configured to control the op-amp output voltage to the predetermined control voltage so that the energization circuit current and an output transistor current of the output transistor of the current mirror circuit are balanced when the voltage charged with the difference current is equal to or greater than the predetermined voltage.

6. The regulator circuit according to claim 5, wherein the energization circuit includes a current source.

7. The regulator circuit according to claim 1, wherein the buffer stage includes a third transistor that is connected between the first transistor and the second transistor to form a cascode.

8. The regulator circuit according to claim 7, wherein the third transistor of the buffer stage has a voltage resistance greater than the first transistor.

9. The regulator circuit according to claim 1, further comprising:
a stabilization power generating circuit that is configured to supply a stabilization power source stepped down from the first power line to a second power line, wherein
the overcurrent controlling circuit employs the second power line as an operation power source.

10. The regulator circuit according to claim 9, wherein the reference voltage generating circuit starts to output the reference voltage after the stabilization power generating circuit outputs the power voltage, which enables the overcurrent controlling circuit to operate stably, to the second power line at a startup.

11. The regulator circuit according to claim 1, wherein the power supply unit is configured to supply an operation power source of the overcurrent controlling circuit to the first power line.

12. The regulator circuit according to claim 11, wherein the reference voltage generating circuit starts to output the reference voltage after the power supply unit outputs the power voltage, which enables the overcurrent controlling circuit to operate stably, to the first power line at a startup.

13. The regulator circuit according to claim 1, wherein a second main energization path of the second transistor of the buffer stage and the output main energization path of the output transistor have voltage resistances greater than the first transistor.

14. The regulator circuit according to claim 1, wherein the reference voltage generating circuit, the operational amplifier, the buffer stage, the output transistor, the feedback circuit, and the overcurrent controlling circuit provide a protection circuit.

* * * * *